US011602947B2

(12) United States Patent
Baldwin et al.

(10) Patent No.: US 11,602,947 B2
(45) Date of Patent: Mar. 14, 2023

(54) METHOD OF MAKING A FLEXOGRAPHIC PRINTING PLATE

(71) Applicant: MacDermid Graphics Solutions LLC, Waterbury, CT (US)

(72) Inventors: Kyle P. Baldwin, Acworth, GA (US); Ryan W. Vest, Mequon, WI (US); Laurie A. Bryant, Douglasville, GA (US)

(73) Assignee: MacDermid Graphics Solutions LLC, Waterbury, CT (US)

( * ) Notice: Subject to any disclaimer, the term of this patent is extended or adjusted under 35 U.S.C. 154(b) by 0 days.

(21) Appl. No.: 16/936,802

(22) Filed: Jul. 23, 2020

(65) Prior Publication Data

US 2022/0024239 A1  Jan. 27, 2022

(51) Int. Cl.
*G03F 7/033* (2006.01)
*B41N 1/12* (2006.01)
*B41F 5/24* (2006.01)

(52) U.S. Cl.
CPC .......... *B41N 1/12* (2013.01); *B41F 5/24* (2013.01); *G03F 7/033* (2013.01)

(58) Field of Classification Search
None
See application file for complete search history.

(56) References Cited

U.S. PATENT DOCUMENTS

| | | |
|---|---|---|
| 3,265,765 A | 8/1966 | Holden et al. |
| 3,597,080 A | 8/1971 | Gush et al. |
| 3,867,153 A | 2/1975 | MacLachlan |
| 3,903,794 A | 9/1975 | Grupe et al. |
| 4,264,705 A | 4/1981 | Allen |
| 4,303,721 A | 12/1981 | Rodriguez |
| 4,320,188 A | 3/1982 | Heinz et al. |
| 4,323,636 A | 4/1982 | Chen |
| 4,323,637 A | 4/1982 | Chen |
| 4,369,246 A | 1/1983 | Chen et al. |
| 4,423,135 A | 12/1983 | Chen et al. |
| 4,427,759 A | 1/1984 | Gruetzmacher et al. |
| 4,574,697 A | 3/1986 | Feeley |
| 4,622,088 A | 11/1986 | Min |
| 5,135,827 A | 8/1992 | Bohm et al. |
| 5,213,949 A | 5/1993 | Kojima et al. |
| 5,223,375 A | 6/1993 | Berrier et al. |
| 5,262,275 A | 11/1993 | Fan |
| 5,325,776 A | 7/1994 | Rather et al. |
| 5,813,342 A | 9/1998 | Strong |
| 5,925,500 A | 7/1999 | Yang et al. |
| 6,238,837 B1 | 5/2001 | Fan |
| 10,429,736 B2 | 10/2019 | Bryant et al. |
| 2008/0107908 A1 | 5/2008 | Long et al. |
| 2018/0314157 A1 * | 11/2018 | Bryant .................... G03F 7/027 |

FOREIGN PATENT DOCUMENTS

| | | | |
|---|---|---|---|
| EP | 0456336 A2 | 11/1991 | |
| EP | 0640878 A1 | 3/1995 | |
| GB | 1366769 A | 9/1974 | |
| WO | WO-2018182536 A1 * | 10/2018 | ........... B29C 64/232 |

* cited by examiner

*Primary Examiner* — Joshua D Zimmerman
(74) *Attorney, Agent, or Firm* — Carmody Torrance Sandak & Hennessey LLP

(57) ABSTRACT

A method of producing a photocured structure comprising a backing layer for coupling to a relief image printing plate or as an integral all-in-one structure comprising a backing layer and a relief image printing layer. The photocured structure may be formed using a continuous liquid interphase method or three-dimensional plating to selectively crosslink and cure a photocurable composition. The backing layer may comprise a lattice or series of openings of the lattice where the placement and density of the openings is controlled.

18 Claims, No Drawings

METHOD OF MAKING A FLEXOGRAPHIC PRINTING PLATE

FIELD OF THE INVENTION

The present invention relates generally to a method of making customizable backing layers for mounting flexographic relief image printing plates having customizable relief printing plate structures including an integral backing layer.

BACKGROUND OF THE INVENTION

Flexography is a method of printing that is commonly used for high-volume runs. Flexographic printing plates are employed for printing on a variety of substrates including paper, paperboard stock, corrugated board, films, foils and laminates.

Flexographic printing plates are relief plates with image elements raised above open areas. Generally, the plate is somewhat soft, flexible enough to wrap around a printing cylinder, and durable enough to print over a million copies. Such plates offer many advantages to the printer, based chiefly on their durability and the ease with which they can be made. A typical flexographic printing plate, as delivered by its manufacturer, is a multilayered article comprising, in order: a support layer; one or more unexposed photocurable layers; optionally a protective layer or slip film; and often, a protective cover sheet.

The support layer lends support to the plate. The support layer can be formed from a transparent or opaque material such as paper, cellulosic film, plastic, or metal. Preferred materials include sheets made from synthetic polymeric materials such as polyesters, polystyrene, polyolefins, polyamides, and the like. One widely used support layer is a flexible film of polyethylene terephthalate.

The photocurable layer(s) can include any of the known polymers, monomers, initiators, reactive and/or non-reactive diluents, fillers, and dyes. As used herein, the term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional relief pattern of cured material. Examples of these photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety.

Photocurable materials generally cross-link (cure) and harden through radical polymerization initiated by exposure to one or more wavelengths of actinic radiation. As used herein, "actinic radiation" refers to radiation that is capable of polymerizing, crosslinking or curing the photocurable layer. Actinic radiation includes, for example, amplified (e.g., laser) and non-amplified light, particularly in the ultraviolet (UV) and violet wavelength regions. Sources of actinic radiation may include, for example, various types of doped or undoped mercury lamps and bulbs, xenon lamps, visible light sources, Light Emitting Diodes (LED's), LASER sources, and sunlight.

The slip film is a thin layer that protects the photopolymer from dust and increases its ease of handling. In a conventional ("analog") plate making process, the slip film is largely transparent to UV light in the wavelengths used for the curing process. The printer peels the cover sheet off the printing plate blank and places a negative on top of the slip film layer. The plate and negative are then subjected to flood-exposure by UV light through the negative. The areas exposed to the light cure, or harden, and the unexposed areas are removed (developed) to create the relief image on the printing plate.

In a "digital" or "computer to plate" process, a laser is guided by an image stored in an electronic data file and is used to create an in situ negative in a digital (i.e., laser ablatable) masking layer. This masking layer is generally a slip film which has been modified to include a radiation opaque material. Portions of the laser ablatable layer are ablated by exposing the masking layer to laser radiation at a selected wavelength and power of the laser to create the in situ negative. Examples of laser ablatable layers are disclosed, for example, in U.S. Pat. No. 5,925,500 to Yang, et al., and U.S. Pat. Nos. 5,262,275 and 6,238,837 to Fan, the subject matter of each of which is herein incorporated by reference in its entirety.

Processing steps for forming flexographic printing plates typically include the following:

1) Image generation, which may comprise mask ablation for digital "computer to plate" printing plates or negative production for conventional analog plates;

2) Back exposure to create a floor layer in the photocurable layer and establish the depth of relief;

3) Face exposure through the mask (or negative) to selectively crosslink and cure portions of the photocurable layer not covered by the mask, thereby creating the relief image;

4) Development to remove unexposed photopolymer by solvent (including water) or thermal development; and 5) If necessary, post exposure and/or detackification.

Removable coversheets may be provided to protect the photocurable printing element from damage during transport and handling. Prior to processing the printing elements, the coversheet is removed, and the photosensitive surface is exposed to actinic radiation in an imagewise fashion. Upon imagewise exposure to actinic radiation, polymerization, and hence, insolubilization of the photopolymerizable layer occurs in the exposed areas. Treatment with a suitable developer solvent (or alternatively, thermal development) removes the unexposed areas of the photopolymerizable layer, leaving behind a printing relief surface that can be used for flexographic printing.

As used herein, the term "back exposure" refers to a blanket exposure to actinic radiation of the photopolymerizable layer on the side opposite that which does, or ultimately will, bear the relief. This step is typically accomplished through a transparent support layer and is used to create a shallow layer of photocured material, i.e., the "floor," on the support side of the photocurable layer. The purpose of the floor is generally to sensitize the photocurable layer and to establish the depth of relief.

Following the brief back exposure step (i.e., brief as compared to the imagewise exposure step which follows), an imagewise exposure is performed through the mask or negative which is in contact with the photocurable layer and through which actinic radiation is directed.

The resulting surface has a relief pattern typically comprising a plurality of dots that reproduces the image to be printed. After the relief image is developed, the resulting flexographic relief image printing element may be mounted on a press and printing commenced.

As an alternative to sheet polymers, flexographic printing elements can be made from liquid photopolymer resins, which have the advantage that uncured resin can be reclaimed from the non-image areas of the printing elements and used to make additional printing plates. Liquid photopolymer resins have a further advantage as compared to sheet polymer in terms of flexibility, which enables the production of any required plate gauge simply by changing the machine settings.

The plates are typically formed by placing a layer of liquid photopolymerizable resin on a glass plate but separated from the glass plate by a substrate and/or a coverfilm. Actinic light (i.e., UV light), is directed against the resin layer through a negative. The result is that the liquid resin is selectively cross-linked and cured to form a printing image surface that mirrors the image on the negative. Upon exposure to actinic radiation, the liquid photopolymer resin polymerizes and changes from a liquid state to a solid state to form the raised relief image. After the process is complete, non-crosslinked liquid resin can be recovered (i.e., reclaimed) from the printing plates and recycled in the process to make additional plates.

Various processes have been developed for producing printing plates from liquid photopolymer resins as described, for example, in U.S. Pat. No. 5,213,949 to Kojima et al., U.S. Pat. No. 5,813,342 to Strong et al., U.S. Pat. Pub. No. 2008/0107908 to Long et al., and U.S. Pat. No. 3,597,080 to Gush, the subject matter of each of which is herein incorporated by reference in its entirety.

Typical steps in the liquid platemaking process include:
(1) casting and exposure;
(2) reclamation;
(3) washout;
(4) post exposure;
(5) drying; and
(6) detackification.

In the casting and exposure step, a photographic negative is placed on a glass platen and a coverfilm is placed on the negative in an exposure unit. All the air is then removed by vacuum so that any wrinkling of the negative or coverfilm can be eliminated. Thereafter, a layer of liquid photopolymer and a backing sheet (i.e., a thin layer of polyester or polyethylene terephthalate) are applied on top of the coverfilm and negative. The backing sheet may be coated on one side to bond with the liquid photopolymer and to serve as the back of the plate after exposure. Then upper and/or lower sources of actinic radiation (i.e., UV lights) are used to expose the photopolymer to actinic radiation to crosslink and cure the liquid photopolymer layer in the areas not covered by the negative. The upper sources of actinic radiation are used to create the floor layer of the printing plate (i.e., back exposure) while the lower sources of actinic radiation are used to face expose the photopolymer to actinic radiation through the negative to create the relief image.

After the exposure is complete, the printing plate is removed from the exposure unit and the photopolymer that was not exposed to actinic radiation (i.e., the photopolymer covered by the negative) is reclaimed for further use. This "reclamation" step typically involves squeegeeing, vacuuming or otherwise removing liquid photopolymer remaining on the surface of the printing plate.

Stereolithography is another process used to create relief image printing plates and involves an additive layering process. Each layer of photopolymer is cured, lifted, back filled with more resin, cured again, and the process is repeated over and over until the required thickness and plate properties are achieved.

Three-dimensional printing has also been suggested for creating relief image printing plates, as described, for example in U.S. Pat. No. 10,429,736 to Bryant et al., the subject matter of which is herein incorporated by reference in its entirety.

The use of a compressible relief image printing plate or, alternatively, mounting a relief image printing plate on a compressible backing layer allows for that layer to deform and compress. An alternative approach involves making the printing plate softer, which can lead to an undesirable growth of the characters under the required printing impression pressure, particularly when printing on rough or uneven stock or on presses with uneven impression and/or plate cylinders.

Compressible relief image printing plates and/or compressible backing layers have found great utility, particularly in the printing of corrugated stock or similar substrates that have an uneven, deformable surface. With such substrates, the printing plate must be flexible so that it will conform to the uneven surface and evenly deliver a coating of ink thereon. However, if the plate is too soft or flexible, the image on the plate will distort under the pressure used to contact the plate with the substrate, and thus will not transfer the image with the desired fidelity.

Compressible printing plates are also useful in:
a) Printing on wide webs (films of cellophane, polyethylene, polypropylene, polyester, vinyl and paper having a web thickness in the range of about 0.5 to 5 mils to overcome sag and distortion and machine gauge variation by the compressibility of foam;
b) Printing safety papers (checks, bond and stock forms) with even uniform constant tone in background print; and
c) Process printing (4 color printing) where uniformity of ink laydown is critical to proper color development.

Compressible printing plates also have a longer life. The mechanical shock to the plate, in each print motion, causes a gradual wearing of the relief, gradually leading to loss of sharpness in print. The compressible layer absorbs the mechanical shock leaving the relief printing surface relatively unaffected (minimal flattening or distortion) resulting in longer plate life.

On their own, high durometer (i.e., hard) plates can often damage a deformable substrate during the printing process. However, a higher durometer plate, in combination with a base compressible layer, potentially can solve both of these issues. In this way, one can use a fairly hard plate which will not provide a distorted image and take advantage of the compressibility of the backing layer to allow the plate to bend and flex, and thereby contact all regions of an uneven substrate.

Typical compressible layers have consisted of foamed materials, oftentimes polyurethane or other thermoplastic materials, which can be laminated to the back of a cured image-bearing printing plate using tape or other pressure sensitive adhesives.

A persistent problem is the difficulty in securing the backing materials (i.e., compressible foam layer) to the back of the plate. It is difficult to apply the adhesive uniformly. Additionally, foam materials exhibit the problem that they stretch during mounting to the plate and, if stabilized, cause buckling when the plate is flexed.

In many instances, the printing plate is already completely exposed and developed before a compressible layer is secured thereto. The compressible layer is formed in a separate step and then pretreated with an adhesive or some sort of tie coat layer to laminate the compressible layer to the printing plate.

Examples of backing materials are described, for example, in U.S. Pat. No. 3,903,794 to Grupe et al., U.S. Pat. No. 4,303,721 to Rodriguez, U.S. Pat. No. 4,574,697 to Feeley, U.S. Pat. No. 5,325,776 to Rather, Sr. et al., the subject matter of each of which is herein incorporated by reference in its entirety.

However, many of these prior art composite and foam materials suffer either from lack of deformability, or if they are readily deformable, from a lack of sufficient resiliency to rebound rapidly enough and repeatedly to the original dimensions.

To compensate for these problems currently it is common practice to use composite and foam materials for printing half tone portions of the copy being reproduced but not for the solid portions of the copy, as they lack sufficient density and caliper accuracy to reproduce solids without a grainy or incomplete (snowflake) appearance. In addition, these composite materials can be difficult to construct.

Thus, there remains a need in the art for an improved customizable compression backing layer for flexographic relief image printing plates that overcomes the deficiencies of the prior art.

SUMMARY OF THE INVENTION

It is an object of the present invention to provide an improved backing layer for a flexographic printing plate.

It is another object of the present invention to streamline the process of making a backing layer.

It is another object of the present invention to provide a customizable backing layer for a flexographic printing plate.

It is still another object of the present invention to provide a customizable backing layer having a lattice structure.

It is still another object of the present invention to produce such a customizable backing layer using a continuous liquid interphase 3D production method.

It is still another object of the present invention to produce a structure comprising a customized backing layer and a relief image printing layer made from the same photocurable composition as an all-in-one configuration.

It is still another object of the present invention to produce a customizable backing layer using a 3D production method in which the physical and chemical properties of the in situ formed backing layer are tailored to achieve beneficial properties of the printing plate during printing, manufacture, and/or storage.

It is still another object of the present invention to tailor the physical and chemical properties of the in situ formed backing layer by varying the cured photopolymer properties selectively or by gradient as a function of depth or position in the backing layer through changes in composition of the photocurable composition and/or changes in curing conditions during the formation of the backing layer.

To that end, in one embodiment, the present invention relates generally to a method of making a photocured structure by continuous liquid interphase printing, the method comprising the steps of:

a) providing a liquid photocurable composition in a reservoir, wherein the photocurable composition comprises:
  i) a binder resin;
  ii) one or more monomers; and
  iii) a photoinitiator package;
  wherein the reservoir comprises a transparent bottom, and wherein a source of actinic radiation is positioned to shine actinic radiation through the transparent bottom to selectively crosslink and cure the liquid photocurable composition; and
b) providing a carrier plate comprising a substrate on said substrate wherein the substrate provides a surface on which the structure is formed, wherein the reservoir is below the carrier plate;
c) bringing the substrate into contact with the liquid photocurable composition in the reservoir;
d) selectively exposing the liquid photocurable composition to actinic radiation beneath the transparent bottom of the reservoir, wherein the actinic radiation crosslinks and cures selected areas of the liquid photocurable composition in the reservoir;
e) moving the carrier plate away from the reservoir while the actinic radiation continuously crosslinks and cures the photocurable composition to form the photocured structure on the carrier plate simultaneously as the carrier plate is withdrawn from the reservoir.

DETAILED DESCRIPTION OF THE PREFERRED EMBODIMENTS

The present invention is directed to an improved method of making customized compressible backing layers for flexographic printing plates using a continuous liquid interphase additive manufacturing method. In addition, the present invention is also directed to a method of making a customized backing layer and relief printing layer structure as an all-in-one configuration.

By using additive manufacturing and in a preferred embodiment, 3D printing methods, the inventors of the present invention have discovered that a backing layer can be produced comprising a lattice structure in which both durometer of material and density of the lattice can be controlled to create an optimum backing layer for various printing substrates. Thus, the lattice structure, in combination with the physical properties of the resin can be combined to produce an optimized and custom backing layer having desired properties of compressibility, modulus and displaceability for a particular application.

In contrast to prior art backing layers of either adhesive foam or solid, the invention described herein provides a method of customizing compressibility of different regions of a plate with different densities based upon specific requirements of the printing plate. For example, within a single plate, the backing layer may comprise both solid regions and high line screens, to produce a 3D printed backing layer with optimized regions with that mirror with features of the relief image printing plate.

The target properties of the backing layer can match existing foam or tape performance, which can vary by application. For example, different properties may be needed and can thus be optimized for printing corrugated plates versus thinner plate applications. In other words, the same photocurable composition can be used to create different target properties in the backing layer and to produce a custom backing layer that mirrors features of the relief image printing plate mounted thereon.

The properties of the backing layer are driven predominantly by print performance including solid ink density and dot gain. Since the structure is unique, the target properties may vary from the prior art materials described above.

The macroscopic target properties of the backing layer are twofold. Firstly, the initial UV curable resin that will be additively formed into the cured photopolymer and secondly, the resultant lattice structure. The resultant physical performance variables include resin properties, including durometer, modulus, tensile, and elongation; UV curing conditions including temperature, choice of lamp type, curing wavelengths, irradiance, and total energy density; post curing techniques; the thickness of the lattice layer; and the lattice structure itself, including density and structure.

There are several options for the backing layer described herein, including an all-in-one lattice base and plate surface structure and a separate lattice base that can be coupled or applied to various plate structures by suitable means.

Durometer and density of the backing layer can be adjusted during additive manufacture by adjusting the time and duration of curing of the compressible material. The properties of the compressible material of the backing layer can be optimized to produce the desired compressible performance.

In one family of embodiments of the invention, the chemical and resultant physical properties of the cured photopolymer composition composing the backing layer are controlled and varied as a function of X-Y position within the plane of the backing layer and/or in the Z position orthogonally to the plane of the backing layer, i.e. as a function of depth/height in the layer. The property differentials may be situated sequentially as continuous or discontinuous series of sub-layers within the backing layer and/or by continuous gradient across the plane or across the thickness of the backing layer.

The invention envisions one or more methods of control of the composition of the backing layer as a function of position within or orthogonal to the plane by varying the composition of the photocurable material as a function of time during the additive manufacturing process.

The invention further envisions one or more methods of control of the properties of the photocured structure composing the backing layer and/or the all-in-one configuration by varying the curing conditions as a function of X-Y and/or Z position within the photocured structure. Such curing conditions may include variables such as:
  a) type of actinic radiation source and/or wavelength(s) of the radiation used to effect the crosslinking and cure of the photocurable composition;
  b) irradiance (intensity) of the actinic radiation;
  c) energy density (dosage) of the actinic radiation;
  d) exposure type, including flood, moving bed, or moving lamp source;
  e) ambient gas conditions (i.e., oxygen content in the ambient air;
  f) temperature of the photocurable composition; and
  g) pre-cure and/or post-cure of the photocurable composition.

Other variables would also be known to those skilled in the art and can be optimized and controlled to achieve the chemical and/or physical properties of the photocured structure.

In one preferred embodiment, the macroscopic design of the lattice comprising the backing layer may be continuous (e.g. isotropic) within the X-Y plane of the backing layer and within the Z vertical direction (i.e. across the thickness) of the backing layer. This type embodiment might include a backing layer resembling an isotropic foam-type layer that is formed through the described additive manufacturing process.

Other preferred embodiments of the invention optionally comprise one or more backing layers, in which the macroscopic structure of the lattice may be anisotropic within the X-Y plane of the backing layer and/or within the Z vertical direction of the backing layer. In one example of such an embodiment, the size and density of pores in a microporous backing layer may be systematically varied across the thickness of the backing layer, providing a more rigid outer layer and a more flexible top layer affixed to the relief layer. In yet another example of such an embodiment, the backing layer might comprise an array of vertical pillars wherein the shape, number, and/or diameter of the pillars may be varied as a function of position across the thickness of the backing layer.

In yet another embodiment of the invention, the density, structure, and composition of the backing layer may be tailored across the X-Y plane of the backing layer. For example, the leading edge, trailing edge, and/or side edges of the plate backing may be designed to have more or less durability and/or elasticity to tailor energy absorption/dissipation at the portions of the plate that experience higher mechanical shock during the printing process.

The surface of the cushioning backing layer can comprise continuous portions and open cell relief portions that may be a lattice structure. Other surface configurations may include protrusions and the cushioning backing layer may be mounted so that the protrusions engage the bottom of the flexographic printing plate or conversely so that the protrusions engage the surface of the printing cylinder. In one embodiment, the protrusions would engage the print cylinder surface and be essentially inverted to the flexographic printing plate surface.

In one embodiment and as described herein, the present invention is directed to providing an improved method of making a compressible backing layer for a flexographic relief image printing plate using a continuous liquid interphase method. Thus, in one embodiment, the present invention relates generally to a method of making a photocured structure by continuous liquid interphase printing, the method comprising the steps of:
  a) providing a liquid photocurable composition in a reservoir, wherein the photocurable composition comprises:
    i) a binder resin;
    ii) one or more monomers; and
    iii) a photoinitiator;
  wherein the reservoir comprises a transparent bottom, and wherein a source of actinic radiation is positioned to shine actinic radiation through the transparent bottom to selectively crosslink and cure the Liquid photocurable composition; and
  b) providing a carrier plate comprising a substrate on said substrate wherein the substrate provides a surface on which the structure is formed, wherein the reservoir is below the carrier plate;
  c) bringing the substrate into contact with the liquid photocurable composition in the reservoir;
  d) selectively exposing the liquid photocurable composition to actinic radiation beneath the transparent bottom of the reservoir, wherein the actinic radiation crosslinks and cures selected areas of the liquid photocurable composition in the reservoir;
  e) moving the carrier plate away from the reservoir while the actinic radiation continuously crosslinks and cures the photocurable composition to form the photocured structure on the carrier plate simultaneously as the carrier plate is withdrawn from the reservoir.

The process of continuous liquid interphase production is a method of additive manufacturing that uses photopolymerization to create solid objects. In the alternative, the continuous liquid interphase method described herein can be used to produce an all-in-one backing layer and relief image printing plate structure by adjusting properties of the photocurable composition during curing to produce both the unique structure of the backing layer and the relief structure of the relief image printing layer.

The continuous process begins with a reservoir of liquid photopolymer, in which the bottom of the reservoir is transparent to actinic radiation. A carrier plate, which is the plate where the flexographic printing plate is to be built, is initially in direct contact with the liquid photocurable composition and subsequently removes the backing layer (or all-in-one structure comprising the backing layer and relief printing layer) from the reservoir as polymerization occurs. An actinic radiation source shines through the transparent bottom of the reservoir and selectively crosslinks and cures the liquid photocurable resin to form the desired structure. As the photocured structure is selectively formed at the base of the reservoir, the carrier plate moves the photocured structure away from the base of reservoir. The liquid photocurable composition continues to be polymerized at the base of the reservoir until the photocured structure is fully formed.

The base of the reservoir contains a surface that is semi-permeable to the polymerization inhibitor which is present in the photocurable composition. There is a gradient formed within the reservoir in which the solid material created by the cross-linking of the photocurable composition and the non-polymerized material overlap at least partially. There is not a sharp interface defined by the amount of polymerization that has occurred and the amount of uncured photocurable composition present in the reservoir.

The reservoir is essentially fixed or stationary, while the carrier plate moves away from the reservoir during production of the photocured structure. Essentially fixed or stationary means only minor motion may occur that does not disrupt the continuous production of polymerized photocurable composition during the production of the photocured structure. If disrupted, the polymerization may continue, although a cleavage line may form. This may be desirable, for example, in the production of the all-in-one photocured structure comprising the backing layer and relief image printing layer. Thus, predetermined cleavage lines may be formed at locations deemed desirable before further continuous formation proceeds.

The source of actinic radiation is located below the reservoir and shines into the transparent bottom of the reservoir. Any conventional sources of actinic radiation can be used for this crosslinking and curing of the photocurable composition, including, for example, carbon arcs, mercury-vapor arcs, fluorescent lamps, electron flash units, LEDs and photographic flood lamps. While not as commonly used, electron-beam or other sources of ionizing radiation optionally be used alone or in combination with UV/visible radiation sources to cure the photocurable composition.

The formation of polymerized material on the surface of the carrier plate is continuous and the polymerized material is in constant contact with the photocurable composition in the reservoir until the formation of the structure is complete. As set forth above, the resulting photocured structure may be the backing layer which is optimized in the manner described above, such as to comprise a lattice structure in the desired pattern and density. In the alternative, the resulting photocured structure may be an all-in-one configuration comprising the backing layer along with an integral relief image printing structure. In addition, optionally, but preferably, the photocured structure may include a floor layer that establishes a depth of relief between the backing layer and the relief image printing structure and the structure, properties, and thickness of the floor layer may be optimized in the manner described above.

In one embodiment, the backing layer comprises a lattice or series of openings to provide a compressible or resilient backing layer. Both the shape and size of the openings in the lattice as well as the placement and the density of the openings in the lattice that make up the backing layer can be controlled to achieve a desired result.

The photocurable composition generally comprises one or more resins, binders and/or plasticizers in combination with one or more photoinitiators and one or more polymerization inhibitors. In one embodiment, the photocurable composition is optimized to create or control the all-in-one structure of the lattice backing layer and the relief printing layer. In this instance, the photocurable composition is selected so that its properties are optimized to be suitable for use as both the lattice backing layer and the relief image printing layer.

Resins suitable for use in the present invention are typically addition-polymerizable ethylenically unsaturated compounds. The photocurable composition may contain a single resin or a mixture of resins, and the resins are typically reactive monomers especially acrylates and methacrylates. Such reactive monomers include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol-200 diacrylate, tetraethylene glycol diacrylate, triethylene glycol diacrylate, pentaerythritol tetraacrylate, tripropylene glycol diacrylate, ethoxylated bisphenol-A diacrylate, trimethylolpropane triacrylate, di-trimethylolpropane tetraacrylate, triacrylate of tris(hydroxyethypisocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate. 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate, urethanemethacrylate or acrylate oligomers and the like which can be added to the photopolymerizable composition to modify the cured product. Monoacrylates including, for example, cyclohexyl acrylate, isobornyl acrylate, lauryl acrylate and tetrahydrofurfuryl acrylate and the corresponding methacrylates are also usable in the practice of the invention. In some embodiments of the invention, one or more other ethylenically unsaturated monomers and/or oligomers may be used including for example, monomer selected from the types: vinyl ester, vinyl ether, N-vinyl amide, maleimide, fumarate, maleate and other types known to those skilled in the art. It is generally preferred that the one or more resins be present in at least an amount of 20% by weight of the photocurable composition.

Binders such as acrylic copolymers, polyolefins, styrenic block copolymers, and other polymers known to those skilled in the art are additionally usable in the compositions of the invention. Particularly suitable binder materials include natural or synthetic polymers of conjugated diolefin hydrocarbons, including 1,2-polybutadiene, 1,4-polybutadiene, butadiene/acrylonitrile, butadiene/styrene, thermoplastic-elastomeric block copolymers e.g., styrene-butadiene-styrene block copolymer, styrene-isoprene-styrene block copolymer, etc., and copolymers. It is generally preferred that the styrenic block copolymers be present in at least an amount of 5% by weight of the photocurable composition.

In one embodiment, the binder resin is functionalized with polymerizable moieties in blocks or randomly distributed along the polymer or oligomer backbone. In this instance, the binder resin comprises copolymers based in part or in whole upon acrylates, methacrylates, styrene, isoprene, butadiene, vinyl acetate, maleates, fumarates, maleimides, vinyl ethers, N-vinyl amides, and vinyl esters, wherein polymerizable double bonds are pendant to the copolymer chain.

The functionalized binder resin is used as a reactive plasticizer, compatibilizer, and/or a polymerizable matrix component in the photocurable composition. In addition, when the functionalized binder resin is used in one or more layers of the photocured structure, wherein the one or more layers are selected from the group consisting of relief printing layers, floor layers, and backing layers.

The photocurable composition also optionally contains a compatible plasticizer. Suitable plasticizers include, but are not limited to, dialkyl phthalates, alkyl phosphates, polyethylene glycol, polyethylene glycol esters, polyethylene glycol ethers, polybutadiene, polybutadiene styrene copolymers, hydrogenated, heavy naphthenic oils, hydrogenated, heavy paraffinic oils, and polyisoprenes. Other useful plasticizers include oleic acid, lauric acid, etc. If used, the plasticizer is generally present in an amount of at least 5% by weight, based on weight of total solids of the photocurable composition.

Photoinitiators for use in the photocurable composition include benzoin alkyl ethers, such as benzoin methyl ether, benzoin ethyl ether, benzoin isopropyl ether and benzoin isobutyl ether. Another class of photoinitiators are the dialkoxyacetophenones such as 2,2-dimethoxy-2-phenylacetophenone and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to, benzophenone, acetophenone, o-methoxybenzophenone, acenaphthenequinone, methyl ethyl ketone, valerophenone, hexanophenone, alpha-phenylbutyrophenone, p-morpholinopropiophenone, dibenzosuberone, 4-morpholinobenzophenone, 4'-morpholinodeoxybenzoin, p-diacetylbenzene, 4-aminobenzophenone, 4'-methoxyacetopherione, benzaldehyde, alpha-tetralone, 9-acetylphenarithrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracene-7-one, 1-naphthaldehyde, 4,4.degree.-bis(dimethylamino)-benzophenone, fluorene-9-one, 1'-acetonaphthone, 2'-acetonaphthone, 2,3-butanedione, acetonaphthene, benz[a]anthracene 7.12 dione, etc. Phosphines such as triphenylphosphine and tri-otolylphosphine can also be used as photoinitiators. Both free radical and cationic types of photopolymerization initiators may be used. It is generally preferred that the photoinitiator(s) be present in at least an amount of 0.1% by weight of the photocurable composition.

In some embodiments, a hydrogen-atom donor synergist may be used to increase the efficiency of the photoinitiator. Such synergists as known to those skilled in the art may include but are not limited to: amines, amides, alkyl ethers, thio ethers, thiols, and others.

In some embodiments, a photosensitizer may be used in combination with the one or more photoinitiators to improve the efficiency of certain photoinitiators when exposed to specific wavelengths of actinic radiation.

In one embodiment, the photocurable composition comprises a polymerization inhibitor. Polymerization inhibitors for use in the photocurable composition include, for example, p-methoxyphenol, hydroquinone, and alkyl and aryl-substituted hydroquinones and quinones, tert-butyl catechol, pyrogallol, copper resinate, naphthalamines, beta-naphthol, cuprous chloride, 2,6-di-tert-butyl-p-cresol, butylated hydroxytoluene (BHT), oxalic acid, phenothiazine, pyridine, nitrobenzene and dinitrobenzene, p-toluquinone and chloranil. While in some instances it may be desirable to include a polymerization inhibitor such as BHT or similar polymerization inhibitors in the photopolymerizable composition, care must be taken to use BHT and other similar polymerization inhibitors only in an amount and with a combination of other additives such that it does not compromise the imaging properties of the photopolymerizable resin. If used, the polymerization inhibitors may be used in the photocurable composition in an amount of about 0.05 to about 5% by weight.

Various dyes and/or colorants may also optionally be used in the practice of the invention although the inclusion of a dye and/or colorant is not necessary to attain the benefits of the present invention. Suitable colorants are designated "window dyes" which do not absorb actinic radiation in the region of the spectrum that the initiator present in the composition is activatable. These colorants include, for example, CI 109 Red dye, Methylene Violet (CI Basic Violet 5), "Luxol." Fast Blue MBSN (CI Solvent Blue 38), "Pontacyl" Wool Blue BL (CI Acid Blue 59 or CI 50315), "Pontacyl" Wool Blue GL (CI Acid Blue 102 or CI 50320), Victoria Pure Blue BO (CI Basic Blue 7 or CI 42595), Rhodamine 3 GO (CI Basic Red 4), Rhodamine 6 GDN (CI Basic Red I or CI 45160), 1,1'-diethyl-2,2'-cyanine iodide, Fuchsine dye (CI 42510), Calcocid Green S (CI 44090), Anthraquinone Blue 2 GA (CI Acid Blue 58), Solvaperm Red BB (Solvent Red 195), etc.

Other additives including antiozonants, fillers or reinforcing agents, UV absorbers, etc. may also be included in the photocurable composition, depending on the final properties desired. Such additives are generally well known in the art. However, care must be taken to ensure that the use of these other additives do not compromise the crosslinking properties of the photocurable composition.

Suitable fillers and/or reinforcing agents include immiscible, polymeric or nonpolymeric organic or inorganic fillers or reinforcing agents which are essentially transparent at the wavelengths used for curing the photocurable composition and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful in improving the strength of the elastomeric layer, reducing tack and, in addition, as coloring agents.

By using continuous liquid interphase 3D methods to produce the compressible backing layer described herein, the resulting structure has a Shore A hardness of between 25 and 95, preferably about 45 and about 70, more preferably between about 50 and about 65. The resulting structure also has an elastomeric elongation of preferably greater than 50%.

In another embodiment, the present invention also relates generally to a method of making a photocured structure by three-dimensional printing, said method comprising:
  a) providing a liquid photocurable composition in a reservoir of a three-dimensional printer, wherein the liquid photocurable composition comprises:
    i) a binder resin;
    ii) monomers; and
    iii) a photoinitiator; and
  b) providing a carrier plate comprising a substrate, wherein the substrate provides a surface on which the photocured structure is formed; and
  c) using the three-dimensional printer to print liquid photocurable composition onto the substrate while exposing the printed photocurable composition to actinic radiation to cure the printed photocurable composition and form the photocured structure.

The hardness of the backing layer and the relief image printing layer is controlled by adjusting the composition of each layer so that the layers will have the desired relative hardness after curing. This can be accomplished, for example, by controlling the amount of cross-linking which occurs during photopolymerization. The amount of cross-linking in a polymer composition is directly proportional to its hardness, which can be controlled to adjust the amount of cross-linking by choosing or making polymers with different degrees of unsaturation. The more unsaturation within a polymer composition, the more cross-linked the polymer will be once cured and, hence, the harder it will be. This and other methods of achieving different degrees of hardness and other desired physical and chemical characteristics of cured photopolymer resins comprising relief image flexographic printing plates are well known to those skilled in the art.

The photocurable layers of the invention should cross-link (cure) and, thereby, harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and infrared wavelength regions. Preferred actinic wavelength regions for curing the photocurable materials of the invention are from about: 250 nm to about 450 nm, more preferably from about 300 nm to about 400 nm, even more preferably from about 320 nm to about 380 nm. One suitable source of actinic radiation is a UV lamp, although other sources are generally known to those skilled in the art.

The photocured structure described herein can be processed as a normal liquid photopolymer is traditionally processed—including the steps of reclaim, washout, post exposure, drying and light finishing to remove the unexposed photopolymer layer.

In one embodiment, the thickness of the backing layer is between about 0.015 and about 0.125 inches and the thickness of the all-in-one structure comprising the backing layer and the relief image printing layer is between about 0.045 and about 0.250 inches.

As used herein, "a," "an," and "the" refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" refers is itself specifically disclosed herein.

As used herein, spatially relative terms, such as "beneath", "below", "lower", "above", "upper" and the like, are used for ease of description to describe one element or feature's relationship to another element(s) or feature(s) as illustrated in the figures. It is further understood that the terms "front" and "back" are not intended to be limiting and are intended to be interchangeable where appropriate.

As used herein, the terms "comprises" and/or "comprising," specify the presence of stated features, integers, steps, operations, elements, and/or components, but do not preclude the presence or addition of one or more other features, integers, steps, operations, elements, components, and/or groups thereof As used herein the term "substantially-free" or "essentially-free" if not otherwise defined herein for a particular element or compound means that a given element or compound is not detectable by ordinary analytical means that are well known to those skilled in the art of metal plating for bath analysis. Such methods typically include atomic absorption spectrometry, titration, UV-Vis analysis, secondary ion mass spectrometry, and other commonly available analytically methods.

Finally, it should also be understood that the following claims are intended to cover all of the generic and specific features of the invention described herein and all statements of the scope of the invention that as a matter of language might fall there between.

What is claimed is:

1. A method of making a photocured structure by continuous liquid interphase printing, wherein the photocured structure comprises a photocured backing layer and a photocured relief image printing layer formed on the photocured backing layer, the method comprising the steps of:
  a) providing a liquid photocurable composition in a reservoir, wherein the photocurable composition comprises:
    i) one or more binder resins;
    ii) one or more monomers; and
    iii) photoinitiator;
  wherein a source of actinic radiation is used to selectively crosslink, and cure the photocurable composition, the reservoir comprises a bottom which is substantially transparent to the wavelength(s) of actinic radiation used to cure the photocurable composition, and wherein the source(s) of actinic radiation is (are) positioned to shine actinic radiation through the transparent bottom of the reservoir; and
  b) providing a carrier plate comprising a substrate, wherein the substrate provides a surface on which the photocured backing layer is formed, and wherein the reservoir is below the carrier plate;
  c) bringing the substrate into contact with the liquid photocurable composition in the reservoir;
  d) selectively exposing the liquid photocurable composition to actinic radiation beneath the transparent bottom of the reservoir, wherein the actinic radiation crosslinks and cures selected areas of the liquid photocurable composition in the reservoir;

e) moving the carrier plate away front the reservoir while the actinic radiation continuously crosslinks and cures the photocurable composition to form the photocured backing layer on the carrier plate simultaneously as the carrier plate is withdrawn from the reservoir;

wherein steps c) and d) are repeated until formation of the photocured backing layer is complete and then steps c) and d) are repeated until formation of the photocured relief image printing layer is complete on top of the photocured backing layer, and wherein the photocured backing layer comprises solid regions and a series of openings and the photocured relief image printing layer comprises solid regions and printing features, wherein the solid regions and the series of openings of the photocured backing layer are formed so as to mirror solid regions and printing features of the photocured relief image printing layer formed thereon; and wherein chemical and physical properties of the liquid photocurable composition are adjusted during curing to control durometer and density of the photocured backing layer and shape, size, placement, and density of the series of openings of the photocured backing layer and shape, size, placement and density of the printing features of the photocured relief image printing layer, wherein properties of compressibility, modulus, and displaceability of the photocured backing layer and relief image printing layer are controlled.

2. The method according to claim 1, wherein the substrate comprises a cured layer of photopolymer on the surface of the substrate on which the photocured backing layer is formed.

3. The method according to claim 1, wherein the carrier plate transports the photocured structure away from the reservoir as layers of crosslinked and cured photocurable composition are continuously formed.

4. The method according to claim 1, wherein the printing features comprise a plurality of printing dots.

5. The method according to claim 1, wherein the thickness of the photocured backing layer is between about 0.015 and about 0.125 inches.

6. The method according to claim 1, where the total thickness of the backing layer and the relief image printing layer is between about 0.045 and about 0.250 inches.

7. The method according to claim 1, wherein the liquid photocurable composition further comprises a polymerization inhibitor, wherein the polymerization inhibitor is selected from the group consisting of p-methoxyphenol, hydroquinone, and alkyl and aryl-substituted hydroquinones and quinones, tert-butyl catechol, pyrogallol, copper resinate, naphthalamines, beta-naphthol, cuprous chloride, 2,6-di-tear-butyl-p-cresol, buts lated hydroxytoluene (BHT), oxalic acid, phenothiazine, pyridine, nitrobenzene and dinitrobenzene, p-toluquinone, chloranil or combinations thereof.

8. The method according to claim 1, wherein the photocured structure comprises varying chemical and/or physical properties of the photocured structure as a function of depth within the plane of the layer(s) and/or across the thickness of the layer(s) of the photocured structure.

9. The method according to claim 8, wherein chemical and/or physical properties of the photocured hacking layer are controlled as a function of position within the X-Y plane of the photocured backing layer and/or across the Z direction (thickness) of the photocured backing layer, wherein such control is established by variation in one or more curing condition variables during crosslinking and curing of the liquid photocurable composition, wherein the one or more curing condition variables are selected from the group consisting of;

a) type of actinic radiation source and/or wavelength(s) of the radiation used to affect the crosslinking and cure of the photocurable composition;

b) irradiance (intensity) of the actinic radiation;

c) energy density (dosage) of the actinic radiation;

d) exposure type, including flood, moving bed, or moving Ian p source;

e) temperature of the photocurable composition; and f) pre-cure and/or post-cure of the photocurable composition.

10. The method according to claims 9, wherein differential chemical and/or physical properties of the photocured backing layer are achieved in a discontinuous gradient across the X-Y plane or across the Z thickness of the layer(s) of the photocured hacking layer.

11. The method according to claim 9, wherein differential chemical and/or physical properties of the photocured backing layer are achieved in a segmented or block pattern within the X-Y plane of the layerts) of the backing layer.

12. The method according to claim 1, wherein the binder resin is functionalized with polymerizable moieties in blocks or randomly distributed along the polymer or oligomer backbone.

13. The method according to claim 1, wherein the binder resin comprises copolymers based in part or in whole upon acrylates, methacrylates, styrene, isoprene, butadiene, vinyl acetate, maleates, fumarates, maleimides, vinyl ethers, N-vinyl amides, and vinyl esters, wherein polymerizable double bonds are pendant to the copolymer chain.

14. The method according to claim 13 wherein the functionalized binder resin is used as a reactive plasticizer, compatibilizer, and/or a polymerizable matrix component in the photocurable composition.

15. A method of making a photocured structure by three-dimensional printing, wherein the photocured structure comprises a backing layer and a photocured relief image printing, layer formed on the photocured backing layer:

a) providing a liquid photocurable composition in a reservoir of a three-dimensional printer, wherein the liquid photocurable composition comprises:
  i) a binder resin;
  ii) monomers; and
  iii) a photoinitiator; and providing a carrier plate comprising a substrate, wherein the substrate provides a surface on which the photocured hacking layer is formed; and c) using the three-dimensional printer to print liquid photocurable composition onto the substrate while exposing the printed photocurable composition to actinic radiation to cure the printed photocurable composition and form the photocured structure, wherein the photocured backing layer comprises solid regions and a series of openings, wherein the solid regions and a series of openings mirror printing features of the relief image printing layer formed thereon, wherein the photocured structure further comprises a relief image printing layer formed on the photocured backing layer, wherein chemical and physical properties of the liquid photocurable composition are adjusted during curing to produce the photocured backing layer and the photocured relief image printing layer thereon, wherein the steps are repeated until formation of the photocured backing layer is complete and then steps are repeated until formation of the photocured relief image printing layer is complete on top of the photocured backing layer, wherein the photocured backing layer comprises solid regions and the series of openings and the photocured relief image printing layer comprises solid regions and printing features, wherein the solid regions and series of openings of the photocured backing layer mirror solid regions and printing features of the photocured relief image printing layer formed thereon; and wherein durometer and density of the photocured backing layer and shape, size, placement, and density of openings of the series of openings are controlled to adjust properties of compressibility, modulus, and displaceability.

16. The method according to claim 15, wherein the printing features comprise a plurality of printing dots.

17. The method according to claim 15, wherein the thickness of the backing layer is between about 0.015 and about 0.125 inches.

18. The method according to claim 17, where the total thickness of the backing layer and the relief image printing layer is between about 0.045 and about 0.250 inches.

* * * * *

UNITED STATES PATENT AND TRADEMARK OFFICE
CERTIFICATE OF CORRECTION

PATENT NO. : 11,602,947 B2
APPLICATION NO. : 16/936802
DATED : March 14, 2023
INVENTOR(S) : Kyle P. Baldwin et al.

It is certified that error appears in the above-identified patent and that said Letters Patent is hereby corrected as shown below:

In the Claims

Column 15, Line 52, Claim 7:
Delete "di-tear-butyl-p-cresol, buts lated" and replace it with –di-tert-butyl-p-cresol, butylated–

Column 15, Line 62, Claim 9:
Delete "hacking" and replace it with –backing–

Column 16, Line 10, Claim 9:
Delete "lan p" and replace it with –lamp–

Column 16, Line 19, Claim 10:
Delete "hacking" and replace it with –backing–

Column 16, Line 50, Claim 15:
Delete "hacking" and replace it with –backing–

Signed and Sealed this
Second Day of May, 2023

Katherine Kelly Vidal
*Director of the United States Patent and Trademark Office*